United States Patent
Lee

(10) Patent No.: US 7,813,191 B2
(45) Date of Patent: Oct. 12, 2010

(54) SEMICONDUCTOR MEMORY DEVICE OVERDRIVING FOR PREDETERMINED PERIOD AND BITLINE SENSE AMPLIFYING METHOD OF THE SAME

(75) Inventor: Sang Hee Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 116 days.

(21) Appl. No.: 12/206,064

(22) Filed: Sep. 8, 2008

(65) Prior Publication Data

US 2009/0161448 A1 Jun. 25, 2009

(30) Foreign Application Priority Data

Dec. 21, 2007 (KR) .................. 10-2007-0135580

(51) Int. Cl.
*G11C 16/04* (2006.01)
(52) U.S. Cl. ............. 365/189.07; 365/205; 365/207; 365/203; 365/230.06
(58) Field of Classification Search ............ 365/189.07, 365/205, 207, 203, 230.06, 189.09, 189.11
See application file for complete search history.

(56) References Cited

U.S. PATENT DOCUMENTS

| 6,754,122 B2 * | 6/2004 | Wada et al. ................ 365/207 |
| 7,505,343 B2 * | 3/2009 | Kang ........................ 365/205 |
| 7,577,045 B2 * | 8/2009 | Matano ................ 365/189.16 |

FOREIGN PATENT DOCUMENTS

| KR | 1020060018973 A | 3/2006 |
| KR | 1020070036634 A | 4/2007 |
| KR | 1020070097805 A | 10/2007 |

* cited by examiner

*Primary Examiner*—David Lam

(57) ABSTRACT

A semiconductor memory device overdriving for a predetermined period when sense amplifying a bitline. An overdriving control unit generates an overdriver enabling signal having an enabling period including a point to enable a bitline sense amplifier and a point to select a column. An overdriver provides an overdrive voltage of a level higher than that of a normal pull-up drive voltage to a pull-up node of the bitline sense amplifier in response to the overdriver enabling signal. The data line pair provides a sufficient difference in potential even for a tRCD_min condition by preventing a drop in the potential of the bitline using the overdrive operation when selecting a column.

32 Claims, 7 Drawing Sheets

US 7,813,191 B2

SEMICONDUCTOR MEMORY DEVICE OVERDRIVING FOR PREDETERMINED PERIOD AND BITLINE SENSE AMPLIFYING METHOD OF THE SAME

CROSS-REFERENCE TO RELATED APPLICATIONS

The present application claims priority to Korean patent application number 10-2007-0135580 filed on Dec. 21, 2007, which is incorporated herein by reference in its entirety.

BACKGROUND OF THE INVENTION

The present invention relates to a semiconductor memory device, and more particularly to a semiconductor memory device which overdrives for a predetermined period when sense amplifying a bitline and a bitline sense amplifying method of the same.

In general, a semiconductor memory device uses overdriving of a bitline sense amplifier for improving a row access strobe (RAS) to column access strobe (CAS) delay time (tRCD), which is an AC property of the core.

A wordline is enabled when an active command is applied, and cell data is thus loaded on a bitline. Charge sharing occurs and the difference in potential of a bitline pair BL, BLB has a predetermined level, as is shown in FIG. 1.

Thereafter, the bitline pair BL, BLB is amplified to the levels of a core voltage VCORE and a ground voltage VSS respectively by a bitline sense amplifier (not shown). At this time, the overdriver is used to improve tRCD.

During the enabled period of an overdrive enabling signal ODEN the overdriver shorts the core voltage VCORE terminal and the power voltage VDD terminal to supply a higher level voltage than the core voltage VCORE to a pull-up node of the bitline sense amplifier.

The overdrive enabling signal ODEN sets the operation period of the overdriver and is typically generated using an overdriving pulse generating circuit having the configuration shown in FIG. 2.

As shown in FIG. 2, the conventional overdriving pulse generating circuit includes a delaying/inverting unit 20, which delays and inverts a sense amplifier enabling signal SAEN; and a combining unit 22, which logically combines the output of the delaying/inverting unit 20 with the sense amplifier enabling signal SAEN to output the overdriver enabling signal ODEN.

A typical overdriving pulse generating circuit having the above described configuration generates an overdriver enabling signal ODEN having a predetermined pulse width using the sense amplifier enabling signal SAEN. At this time, the pulse width of the overdriver enabling signal ODEN is the extent of the delay created by the delaying/inverting unit 20.

However, the extent of the delay created by the delaying/inverting unit 20 varies with the external environment, for example the process, voltage, and temperature (PVT).

Particularly, when the pulse width of the overdriver enabling signal ODEN becomes larger than the target due to an increase in the extent of the delay, the time in which the core voltage VCORE terminal and the power voltage VDD terminal are shorted is lengthened. As a result, the level of the overdrive voltage is increased to a level more than that which is needed. Accordingly, there is a problem, in that the potential of the bitline is higher than the core voltage VCORE even during normal driving of the bitline sense amplifier, and thus normal precharge is not carried out during precharge, thereby causing defects.

Additionally, the pulse width of the overdriver enabling signal ODEN becomes smaller than the target when the extent of the delay is decreased due to the external environment. In this case, there is a problem, in that the tRCD property becomes inferior, since overdriving of the bitline sense amplifier is not carried out sufficiently.

Meanwhile, as shown in FIG. 1, a column selection signal YI is enabled after a predetermined time from the completion of overdriving, and the bitline pair BL, BLB and a local data line pair LIO, LIOB are connected.

At this time, the local data line pair LIO, LIOB is precharged to a level lower than the core voltage VCORE (typically, ½ VCORE), and therefore a drop in the voltage level occurs in the bitline BL, which has the level of the core voltage VCORE when the bitline pair BL, BLB and the local data line pair LIO, LIOB are connected.

Particularly, if there is a large drop in the level of the bitline voltage or if the bitline does not recover sufficiently within a predetermined time according to a minimum RAS to CAS delay time (tRCD_min) condition, the local data line pair LIO, LIOB may not have a sufficient difference in potential.

When this occurs, the sensing operation of the data sense amplifier 10, which sense amplifies the potential difference of the local data line pair LIO, LIOB, is either not carried out normally or delayed. Accordingly, a problem results, in that data is delivered late to a global data line GIO, and defects in subsequent operation occur.

SUMMARY OF THE INVENTION

There is provided a semiconductor memory device that prevents defects caused by a voltage drop in the bitline occurring when selecting a column, and a bitline sense amplifying method of the same.

Also, there is provided a semiconductor memory device that prevents defects due to lack of or excess overdriving by properly controlling the overdriving period, and a bitline sense amplifying method of the same.

In the semiconductor memory device according to an embodiment of the present invention, an overdriving control unit generates an overdriver enabling signal having an enabling period including a point to enable a bitline sense amplifier and a point to select a column. An overdriver provides an overdrive voltage of level higher than that of a normal pull-up drive voltage to a pull-up node of the bitline sense amplifier in response to the overdriver enabling signal.

Preferably, the overdriving control unit generates the overdriver enabling signal in response to a sense amplifier enabling signal, which is enabled by an active command and disabled by a precharge command, and a column pulse, which is the source of a column selection signal for connecting a bitline and a data line.

Preferably, the enabling period generated by the overdriving control unit includes a first enabling period including the point to enable a bitline sense amplifier and a second enabling period including the point to select a column. The first enabling period is enabled in response to the sense amplifier enabling signal, and the second enabling period is enabled in response to the column pulse. The first and the second enabling periods are separated from each other.

Preferably, the overdriving control unit includes a first overdriving pulse generation unit generating a first overdriving pulse having the first enabling period in response to the sense amplifier enabling signal; a second overdriving pulse generation unit generating a second overdriving pulse having the second enabling period in response to the column pulse;

and an overdriver enabling unit logically combining the first and second overdriving pulses to generate the overdriver enabling signal.

Preferably, the second overdriving pulse generation unit generates the second overdriving pulse having second enabling period including the enabling period of the column selection signal generated by the column pulse.

Preferably, the overdriver enabling unit generates an overdriver enabling signal which is enabled when at least one of the first overdriving pulse and the second overdriving pulse is in an enabled state.

Preferably, the overdriving control unit also includes a level detection unit outputting a detection signal by comparing the overdrive voltage with a reference voltage; and a combining unit logically combining the detection signal and the second overdriving pulse and providing the combined signal to the overdriver enabling unit.

Preferably, the level detection unit enables and outputs the detection signal when the overdrive voltage is lower than a level of the reference voltage.

Preferably, the combining unit disables the second overdriving pulse when the detection signal is in a disabled state and enables the second overdriving pulse when the detection signal is in an enabled state, and provides the second overdriving pulse to the overdriver enabling unit.

According to another embodiment of the present invention, there is provided a semiconductor memory device which includes: a sense amplifier driver providing a normal pull-up drive voltage to a pull-up node, providing a normal pull-down drive voltage to a pull-down node, and selectively providing an overdrive voltage having a level higher than the level of the normal pull-up drive voltage to the pull-up node according to a state of an overdriver enabling signal; a bitline sense amplifier sense amplifying a difference in potential between bitlines including a bitline pair with the voltages supplied to the pull-up node and the pull-down node; and an overdriving control unit generating the overdriver enabling signal having an enabling period including a point to select a column, and detecting a potential of the pull-up node to control the state of the overdriver enabling signal.

Preferably, the overdriving control unit includes an overdriving pulse generation unit generating an overdriving pulse using a column pulse generated by a column command; a level detection unit outputting a detection signal by comparing the levels of the potential of the pull-up node and the reference voltage; and an overdriver enabling unit logically generating the overdrive enabling signal by combining the overdriving pulse and the detection signal.

Preferably, the overdriving pulse generation unit generates an overdriving pulse whose period includes an enabling period of a column selection signal generated by the column pulse.

Preferably, the level detection unit compares the potential of the pull-up node and the level of the reference voltage in response to a strobe signal generated during a read or write operation.

Preferably, the level detection unit enables and outputs the detection signal when the potential of the pull-up node is lower than the level of the reference voltage.

Preferably, the overdriver enabling unit disables and outputs the overdriver enabling signal when the detection signal is in a disabled state and enables and outputs the overdriver enabling signal when the detection signal is in an enabled state.

According to another embodiment of the present invention, there is provided a semiconductor memory device, which includes: a first overdriving pulse generation unit generating a first overdriving pulse having a first enabling period including a point to enable a bitline sense amplifier in response to a sense amplifier enabling signal; a second overdriving pulse generation unit generating a second overdriving pulse having a second enabling period including a point to select a column in response to a column pulse generated by a column command; a level detection unit outputting a detection signal by comparing a potential of a pull-up node of a bitline sense amplifier and a level of a reference voltage; an overdriver enabling unit generating the overdriver enabling signal by logically combining the first and second overdriving pulses and the detection signal; and an overdriver providing an overdrive voltage of high level than a normal pull-up drive voltage to the pull-up node of the bitline sense amplifier in response to the overdriver enabling signal.

Preferably, the sense amplifier enabling signal is a signal enabled by an active command and disabled by a precharge command, and the column pulse a source of a column selection signal for connecting the bitline and the data line.

Preferably, the second overdriving pulse generation unit generates the second overdriving pulse having the second enabling period including an enabling period of the column selection signal.

Preferably, the level detection unit enables and outputs the detection signal when the level of the overdrive voltage is higher than the level of the reference voltage.

Preferably, the overdriver enabling unit includes a first combining unit logically combining the first overdriving pulse and the detection signal and outputting a combined signal which corresponds to the first overdriving pulse when the detection signal is in a disabled state and is disabled when the detection signal is in an enabled state; and a second combining unit logically combining the combined signal and the second overdriving pulse and outputting the overdriver enabling signal which is enabled when at least one of the combined signal and the second overdriving pulse is enabled.

Preferably, the level detection unit enables and outputs the detection signal when the level of the overdrive voltage is lower than the level of the reference voltage.

Preferably, the overdriver enabling unit includes, in response to the configuration of the above level detection unit, a first combining unit logically combining the second overdriving pulse and the detection signal and outputting a combined signal which corresponds to the second overdriving pulse when the detection signal is in an enabled state and is disabled when the detection signal is in a disabled state; and a second combining unit logically combining the combined signal and the first overdriving pulse and outputting the overdriver enabling signal which is enabled when at least one of the combined signal and the first overdriving pulse is enabled.

Preferably, the level detection unit includes a first detection unit comparing the levels of the overdrive voltage and the first reference voltage, and enabling and outputting the first detection signal when the level of the overdrive voltage is higher than the level of the first reference voltage; and a second detection unit comparing the levels of the overdrive voltage and the second reference voltage, and enabling and outputting the second detection signal when the level of the overdrive voltage is lower than the level of the second reference voltage.

Preferably, the overdriver enabling unit includes, in response to the configuration of the above level detection unit, a first combining unit logically combining the first overdriving pulse and the first detection signal and outputting a first combined signal which corresponds to the first overdriving pulse when the first detection signal is in a disabled state and is disabled when the first detection signal is in an enabled state; a second combining unit logically combining the second overdriving pulse and the second detection signal and outputting a second combined signal which corresponds to the second overdriving pulse when the second detection signal is in an enabled state and is disabled when the second detection signal is in a disabled state; and a third combining unit logically combining the first combined signal and the second combined signal and outputting the overdriver enabling signal which is enabled when at least one of the first and second combined signals is enabled.

According to another embodiment of the present invention, there is provided a bitline sense amplifying method, which includes: a first overdriving step comprising differential amplifying a bitline pair with an overdrive voltage and a normal pull-down drive voltage from an enabling point of a sense amplifier enabling signal to a first point; a first normal driving step comprising differential amplifying the bitline pair with a normal pull-up drive voltage and the normal pull-down drive voltage from the first point to an enabling point of a column pulse; a second overdriving step comprising differential amplifying the bitline pair with the overdrive voltage and the normal pull-down drive voltage from the enabling point of a column pulse to a second point; and a second normal driving step comprising differential amplifying the bitline pair to the normal pull-up drive voltage and the normal pull-down drive voltage from the second point to a precharge point.

Preferably, the overdrive voltage is a voltage of having a level higher than the level of the normal pull-up drive voltage, and the normal pull-up drive voltage is a voltage having a level higher level than that of the normal pull-down drive voltage.

Preferably, the overdrive voltage is a power voltage or a boosting voltage, the normal pull-up drive voltage is a core voltage, and the normal pull-down drive voltage is a ground voltage.

Preferably, the sense amplifier enabling signal is a signal which is enabled by an active command and disabled by a precharge command, and the column pulse is the source of a column selection signal for connecting the bitline pair and a data line pair.

Preferably, the bitline pair and a data line pair are connected within the enabling point of the column pulse to the second point.

Preferably, the first overdriving step includes an overdriving adjusting step detecting a potential of a first bitline amplified with the overdrive voltage and adjusting the first point.

Preferably, the overdriving adjusting step sets the first point to when the potential of the first bitline exceeds the level of a reference voltage.

Preferably, the second overdriving step includes an overdriving adjusting step detecting a potential of a first bitline and adjusting the point at which the first bitline is amplified with the overdriving voltage.

Preferably, in the overdriving step, the first bitline is amplified with the first overdrive voltage when the potential of the first bitline is lower than the level of the reference voltage.

DESCRIPTION OF SPECIFIC EMBODIMENTS

Hereinafter, preferred embodiments of the present invention will be described in detail with reference to the accompanying drawings.

The present invention includes a semiconductor memory device that overdrives a bitline sense amplifier to prevent a drop in voltage level in the bitline during a column selection operation, and a bitline sense amplifying method of the same. Particularly, in the present invention, it is possible to sense the potential of the bitline and properly control the overdrive period during the overdrive operation including the column selection operation.

Figure 1:
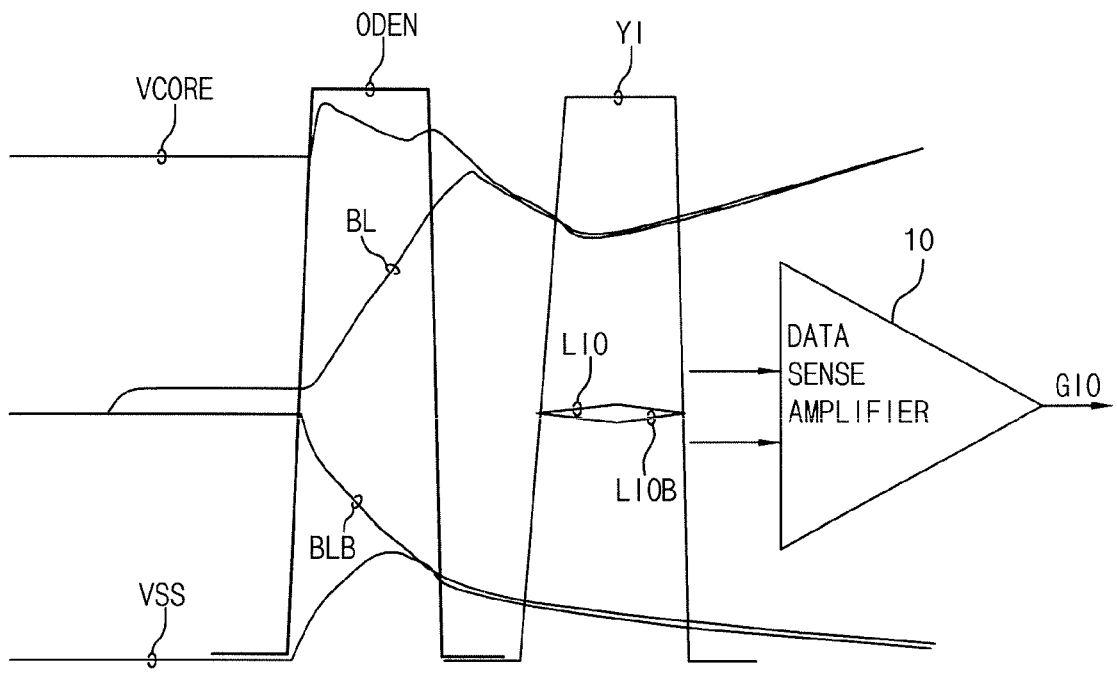
FIG. 1 is a waveform diagram for explaining a conventional overdriving operation.
Figure 2:
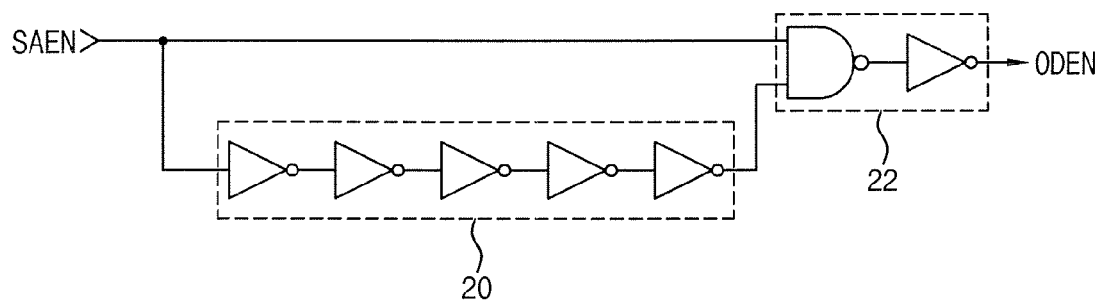
FIG. 2 is a circuit diagram showing the circuit generating overdriver control signal ODEN of FIG. 1.
Figure 3:
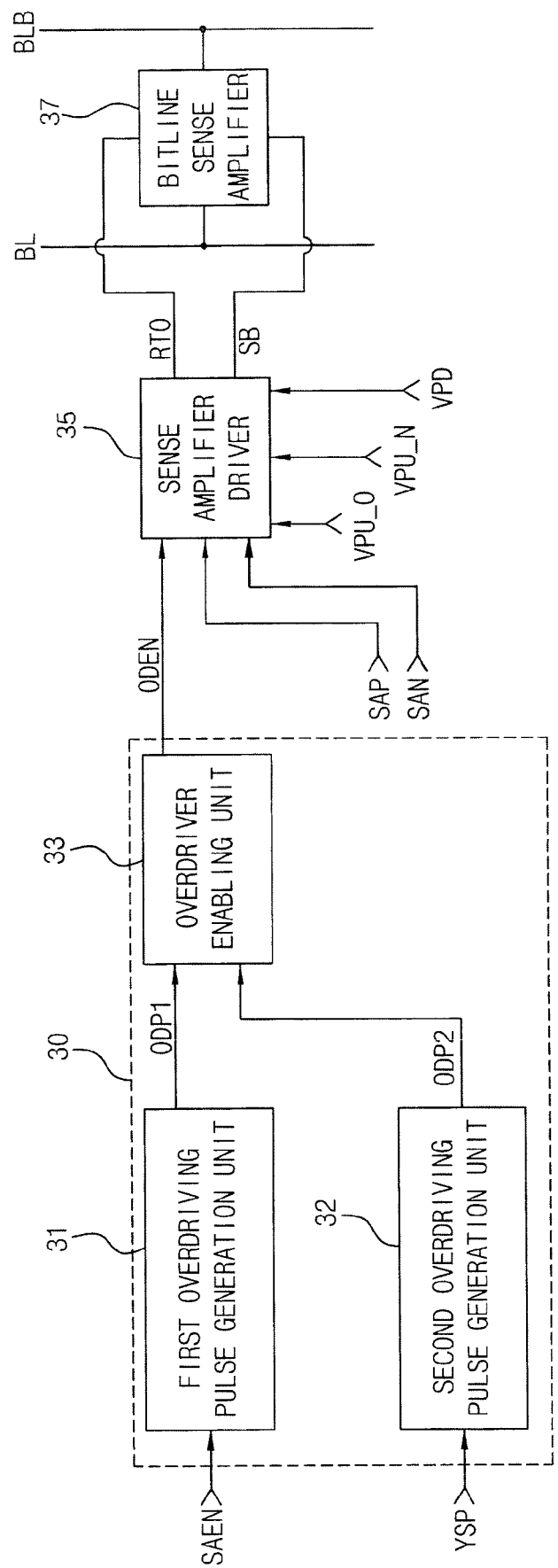
FIG. 3 is a block diagram showing a semiconductor memory device according to an embodiment of the present invention.

FIG. 3 is a block diagram showing a semiconductor memory device according to an embodiment of the present invention.

Referring to FIG. 3, a semiconductor memory device according to an embodiment of the present invention includes, for example, an overdriving control unit 30, a sense amplifier driver 35, and a bitline sense amplifier 37.

The overdriving control unit 30 generates an overdriver enabling signal ODEN having an enabling period that includes an enabled point to enable the bitline sense amplifier 37 and an enabled point to select a column. The overdriver enabling signal ODEN is generated in response to a sense amplifier enabling signal SAEN and a column pulse YSP generated by a column command.

Herein, the sense amplifier enabling signal SAEN is a signal that is enabled by an active command and disabled by a precharge command. Particularly, the sense amplifier enabling signal SAEN is enabled after a predetermined period of time from the input of the active command and is disabled after a predetermined period of time from the input of the precharge command.

The column pulse YSP is a pulse that becomes the source of a column selection signal for connecting a bitline pair BL, BLB and a data line pair (not shown). Particularly, after being delayed for a predetermined time, the column pulse YSP is combined with a column address to generate the column selection signal.

The sense amplifier driver 35 provides a normal pull-up drive voltage VPU_N or an overdrive voltage VPU_O to a pull-up node RTO according to the state of the overdriver enabling signal ODEN when the pull-up signal SAP is enabled. The sense amplifier driver 35 provides a normal pull-down drive voltage VPD to a pull-down node SB when the pull-down signal SAN is enabled.

Herein, the overdrive voltage VPU_O has a higher voltage level than the normal pull-up drive voltage VPU_N. The overdrive voltage VPU_O is preferably a power voltage VDD or a pumping voltage VPP when the normal pull-up drive voltage VPU_N is a core voltage VCORE.

Additionally, the normal pull-down drive voltage VPD has a lower voltage level than the normal pull-up drive voltage VPU_N. The normal pull-down drive voltage VPD is preferably a ground voltage VSS.

The bitline sense amplifier 37 sense amplifies the difference in potential of the bitline pair BL, BLB with voltages provided to the pull-up node RTO and the pull-down node SB.

In the semiconductor memory device according to an embodiment of the present invention, the overdriving control unit 30 includes a first overdriving pulse generation unit 31, a second overdriving pulse generation unit 32, and an overdriver enabling unit 33.

The first overdriving pulse generation unit 31 generates an overdriving pulse ODP1 having an enabling period that includes the point to enable the bitline sense amplifier 37 in response to the sense amplifier enabling signal SAEN.

The second overdriving pulse generation unit 32 generates an overdriving pulse ODP2 having an enabling period that includes the point of to select the column in response to the column pulse YSP. The enabling period of the overdriving pulse ODP2 includes the enabling period of the column selection signal (which controls column selection). The overdriving pulse ODP2 preferably has a pulse width wider than the column selection signal and surrounding the column selection signal.

The overdriver enabling unit 33 logically combines the overdriving pulse ODP1 and the overdriving pulse ODP2 to output the overdriver enabling signal ODEN. Particularly, the overdriver enabling unit 33 outputs the overdriver enabling signal ODEN in an enabled state when at least one of the overdriving pulse ODP1 and the overdriving pulse ODP2 is enabled.

Figure 4:
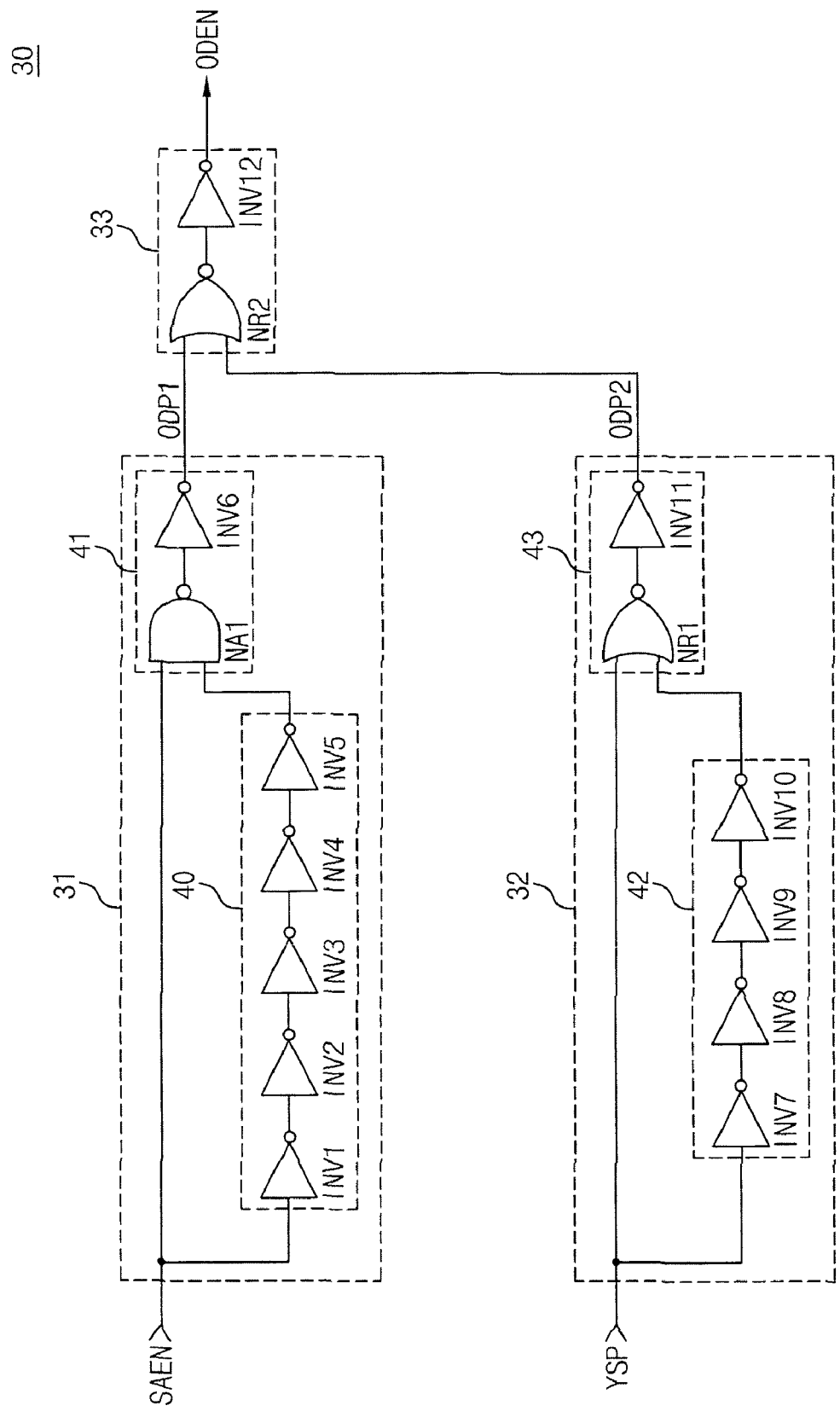
FIG. 4 is a circuit diagram showing the detailed configuration of the overdriving control unit of FIG. 3.

The above described overdriving control unit 30 including the first overdriving pulse generation unit 31, the second overdriving pulse generation unit 32, and the overdriver enabling unit 33 may be specifically configured with the circuit shown in FIG. 4.

Referring to FIG. 4, the first overdriving pulse generation unit 31 includes a delaying/inverting unit 40 which delays and inverts the sense amplifier enabling signal SAEN.

Herein, the delaying/inverting unit 40 includes an odd number of inverters INV1~INV5 connected in series between an input terminal into which the sense amplifier enabling signal SAEN is inputted and an input terminal of a combining unit 41.

Also, the first overdriving pulse generation unit 31 includes a combining unit 41 which logically combines the sense amplifier enabling signal SAEN and the output of the delaying/inverting unit 40 to output the overdriving pulse ODP1.

Herein, the combining unit 41 may include a NAND gate NA1, which performs a NAND logical operation on the sense amplifier enabling signal SAEN and the output of the delaying/inverting unit 40; and an inverter INV6, which inverts the output of the NAND gate NA1 to output the overdriving pulse ODP1.

The second overdriving pulse generation unit 32 includes a delaying unit 42 which delays the column pulse YSP.

Herein, the delaying unit 42 includes an even number of inverters INV7~INV10 connected in series between an input terminal into which the column pulse YSP is inputted and the input terminal of the combining unit 43.

Also, the second overdriving pulse generation unit 32 includes a combining unit 43 which logically combines the column pulse YSP and the output of the delaying unit 42 to output the overdriving pulse ODP2

Herein, the combining unit 43 may include a NOR gate NR1, which performs a NOR logical operation on the column pulse YSP and the output of the delaying unit 42; and an inverter INV11, which inverts the output of the NOR gate NR1 to output the overdriving pulse ODP2.

The overdriver enabling unit 33 may include a NOR gate NR2, which performs a NOR logical operation on the overdriving pulse ODP1 and the overdriving pulse ODP2; and an inverter INV12, which inverts the output of the NOR gate NR2 to output the overdriver enabling signal ODEN.

Figure 5:
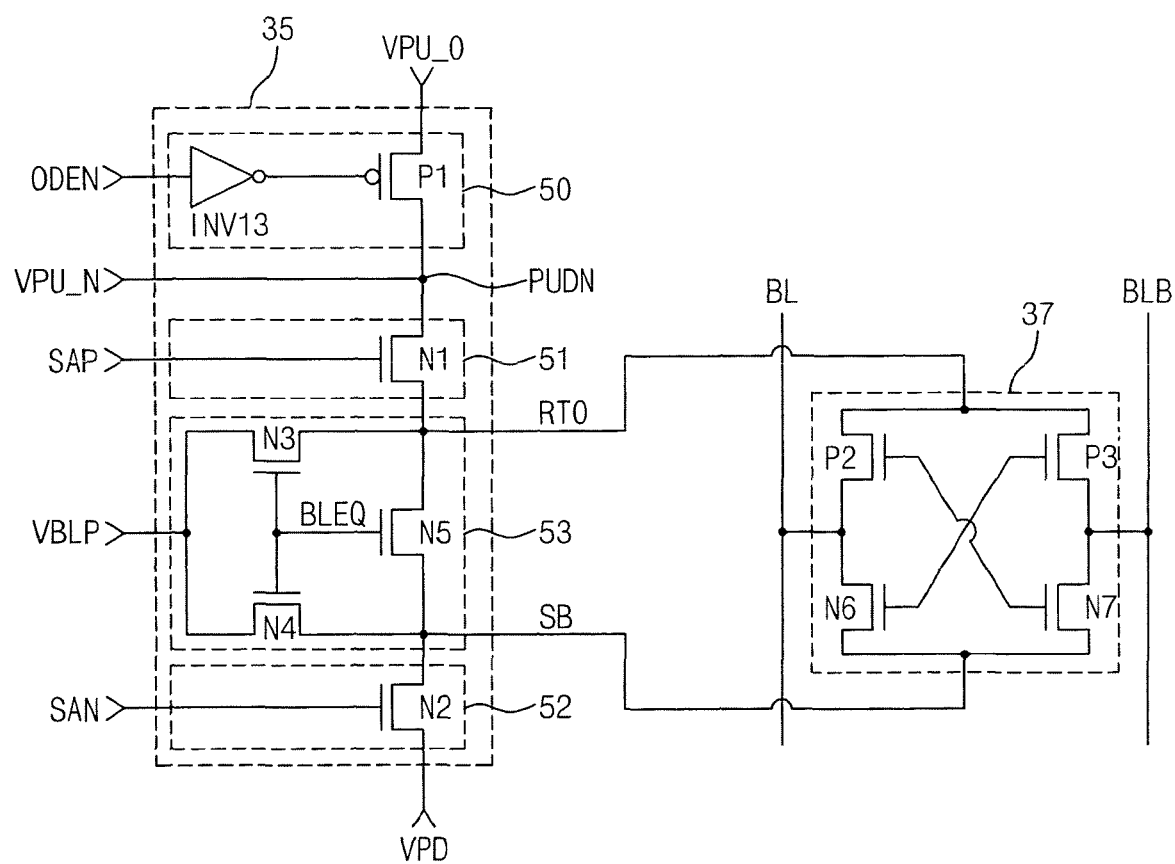
FIG. 5 is circuit diagram showing detailed configurations of the sense amplifier driver and the bitline sense amplifier of FIG. 3.

Meanwhile, the sense amplifier driver 35 and the bitline sense amplifier 37 of FIG. 3 may have the configurations shown in FIG. 5.

Referring to FIG. 5, the sense amplifier driver 35 includes an overdriver 50, a pull-up driver 51, a pull-down driver 52, and a precharge unit 53.

The overdriver 50 provides the overdrive voltage VPU_O to a pull-up drive node PUDN in response to the overdriver enabling signal ODEN. The overdriver 50 includes an inverter INV13, which inverts the overdriver enabling signal ODEN; and a PMOS transistor P1, which receives the output of the inverter INV13 via its gate and provides the overdrive voltage VPU_O to the pull-up drive node PUDN. Herein, the pull-up drive node PUDN is a node to which the normal pull-up drive voltage VPU_N is supplied.

The pull-up driver 51 provides the voltage supplied to the pull-up drive node PUDN to the pull-up node RTO in response to a pull-up signal SAP. The pull-up driver 51 may include an NMOS transistor N1 which receives the pull-up signal SAP via its gate and provides the voltage supplied to the pull-up drive node PUDN to the pull-up node RTO.

The pull-down driver 52 provides a pull-down drive voltage VPD to the pull-down node SB in response to a pull-down signal SAN. The pull-down driver 52 may include a NMOS transistor N2 which receives the pull-down signal SAN via its gate and provides the pull-down drive voltage VPD to the pull-down node SB.

The precharge unit 53 precharges the pull-up node RTO and the pull-down node SB to the level of the precharge voltage VBLP in response to a bitline equalization signal BLEQ. The precharge unit 53 may include: NMOS transistors N3 and N4, which receive the bitline equalization signal BLEQ via their respective gates and which provide the precharge voltage VBLP to the pull-up node RTO and the pull-down node SB respectively; and a NMOS transistor N5, which receives the bitline equalization signal BLEQ via its gate and is connected between the pull-up node RTO and the pull-down node SB.

The bitline sense amplifier 37 may include two PMOS transistors P2, P3 and two NMOS transistors N6, N7 connected in a cross coupled structure between the bitline pair BL, BLB. The two PMOS transistors P2, P3 and two NMOS transistors N6, N7 receive voltages supplied to the pull-up node RTO and the pull-down node SB respectively.

The operation of the semiconductor memory device according to an embodiment of the present invention having the configuration described above will now be described with reference to FIGS. 3 to 6.

When the active command is received, the wordline is enabled and cell data is loaded on the bitline BL, thereby creating charge sharing between the bitline pair BL, BLB.

After the charge sharing between the bitline pair BL, BLB, the sense amplifier enabling signal SAEN, the pull-up signal SAP, and the pull-down signal SAN are enabled and the bitline sense amplifier 37 sense amplifies the difference in potential between the bitline pair BL, BLB.

At this time, the first overdriving pulse generation unit 31 receives the sense amplifier enabling signal SAEN and generates the overdriving pulse ODP1 having a predetermined pulse width, and the overdriving pulse ODP1 is outputted as the overdriver enabling signal ODEN via the overdrive enabling unit 33.

The sense amplifier driver 35 supplies the overdrive voltage VPU_O to the pull-up node RTO of the bitline sense amplifier 37 in response to the overdriver enabling signal ODEN outputted from the overdrive enabling unit 33, thereby carrying out overdriving of the bitline sense amplifier 37.

In other words, when the sense amplifier enabling signal SAEN is enabled, the overdriver enabling signal ODEN is enabled for a predetermined time via the first overdriving pulse generation unit 31 and the overdrive enabling unit 33.

When the overdriver enabling signal ODEN is enabled, the overdrive voltage VPU_O is supplied to the pull-up drive node PUDN, and the level of the normal pull-up drive voltage VPU_N is increased by the overdrive voltage VPU_O.

The increased normal pull-up drive voltage VPU_N is supplied to the pull-up node RTO when the pull-up signal SAP is enabled, and the level of the bitline BL is rapidly increased by the pull-up operation of the sense amplifier 37.

Thereafter, the overdriver enabling signal ODEN is disabled, and the normal pull-up drive voltage VPU_N drops to its original level (for example, to the level of the core voltage VCORE), and the bitline pair BL, BLB is amplified to the levels of the normal pull-up drive voltage VPU_N and the normal pull-down drive voltage VPD respectively.

When the column pulse YSP is generated by a read or write command, the column pulse YSP is delayed for a predetermined time and combined with the column address, thereby generating a column selection signal YI.

The bitline pair BL, BLB and the local data line pair LIO, LIOB are connected in response to the column selection signal YI and data loaded on the bitline pair BL, BLB is thus delivered to the local data line pair LIO, LIOB.

Figure 6:
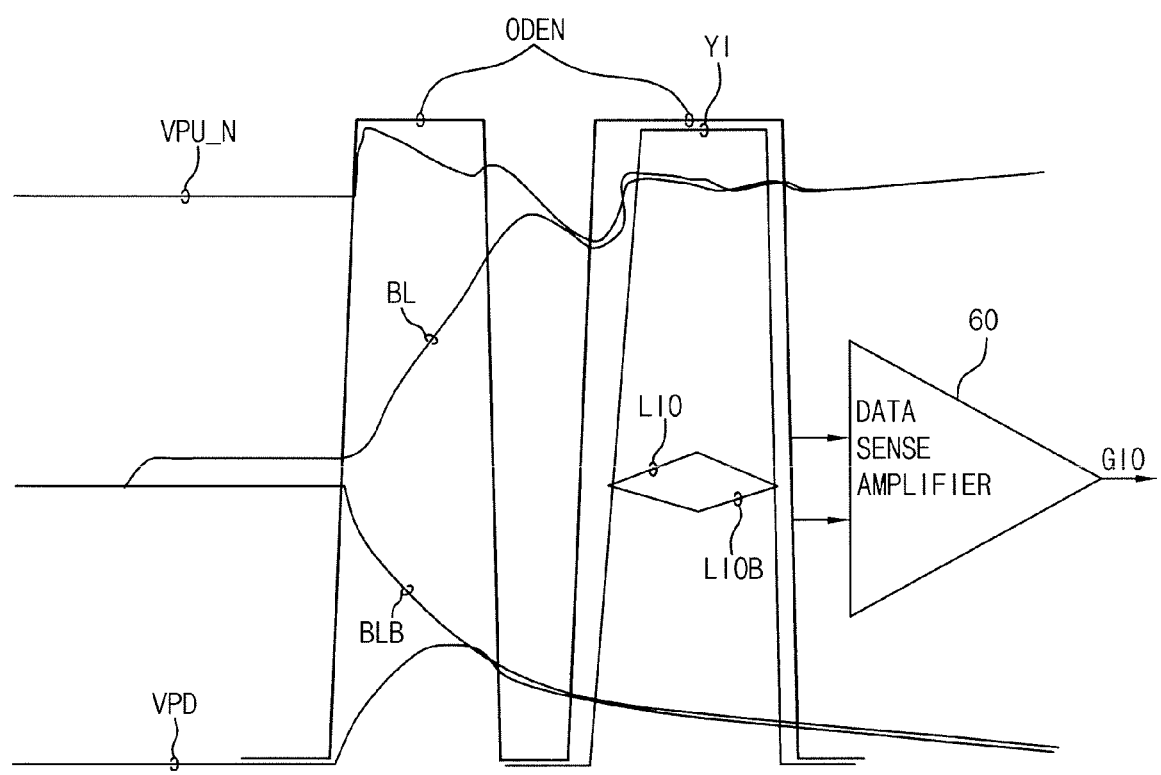
FIG. 6 is a waveform diagram for explaining the overdriving operation of the semiconductor memory device according to an embodiment of the present invention.

Before the generation of the column selection signal YI, the second overdriving pulse generation unit 32 receives the column pulse YSP and generates the overdriving pulse ODP2 having a predetermined pulse width. The overdriving pulse ODP2 is outputted as the overdriver enabling signal ODEN via the overdrive enabling unit 33. At this time, it is preferable that the overdriver enabling signal ODEN is enabled prior to the column selection signal YI and disabled after the column selection signal YI is disabled, as is illustrated in FIG. 6.

The overdrive voltage VPU_O is supplied to the pull-up drive node PUDN in response to the overdriver enabling signal ODEN. Accordingly, overdriving of the bitline sense amplifier 37 is carried out, and the potential of the bitline BL is increased.

Thereafter, the column selection signal YI is enabled, and a drop in potential in the bitline BL occurs when the bitline pair BL, BLB and the local data line pair LIO, LIOB are connected. However, the potential of the bitline BL does not drop rapidly due to overdriving of the bitline sense amplifier 37. Preferably, the bitline BL is maintained at the level of the normal pull-up drive voltage VPU_N (for example, the core voltage VCORE).

Accordingly, the local data line pair LIO, LIOB has a sufficient difference in potential, and the bitline sense amplifier 37 can sense amplify the difference in potential between the local data line pair LIO, LIOB in a stable manner and deliver the sense amplified difference in potential to the global data line GIO.

As is apparent from the above description, the semiconductor memory device according to an embodiment of the present invention prevents a drop in potential in the bitline, which occurs when the bitline pair is connected to the data line pair, by overdriving the bitline sense amplifier when selecting the column.

Particularly, the semiconductor memory device according to an embodiment of the present invention enables an overdriver enabling signal before the column selection signal is enabled to sufficiently raise the potential of the bitline.

Accordingly, the potential of the bitline does not drop rapidly and is maintained at a level very near that of the normal pull-up drive voltage even when the column selection signal is enabled; and as a result, the data line pair has a sufficient difference in potential even within the tRCD_min condition.

Therefore, a sensing operation of the data sense amplifier, which sense amplifies the difference in potential between the data line pair, can be carried out normally, and thus the present invention provides an advantage in that defects in the operation of the data sense amplifier or in subsequent operation are prevented.

Figure 7:
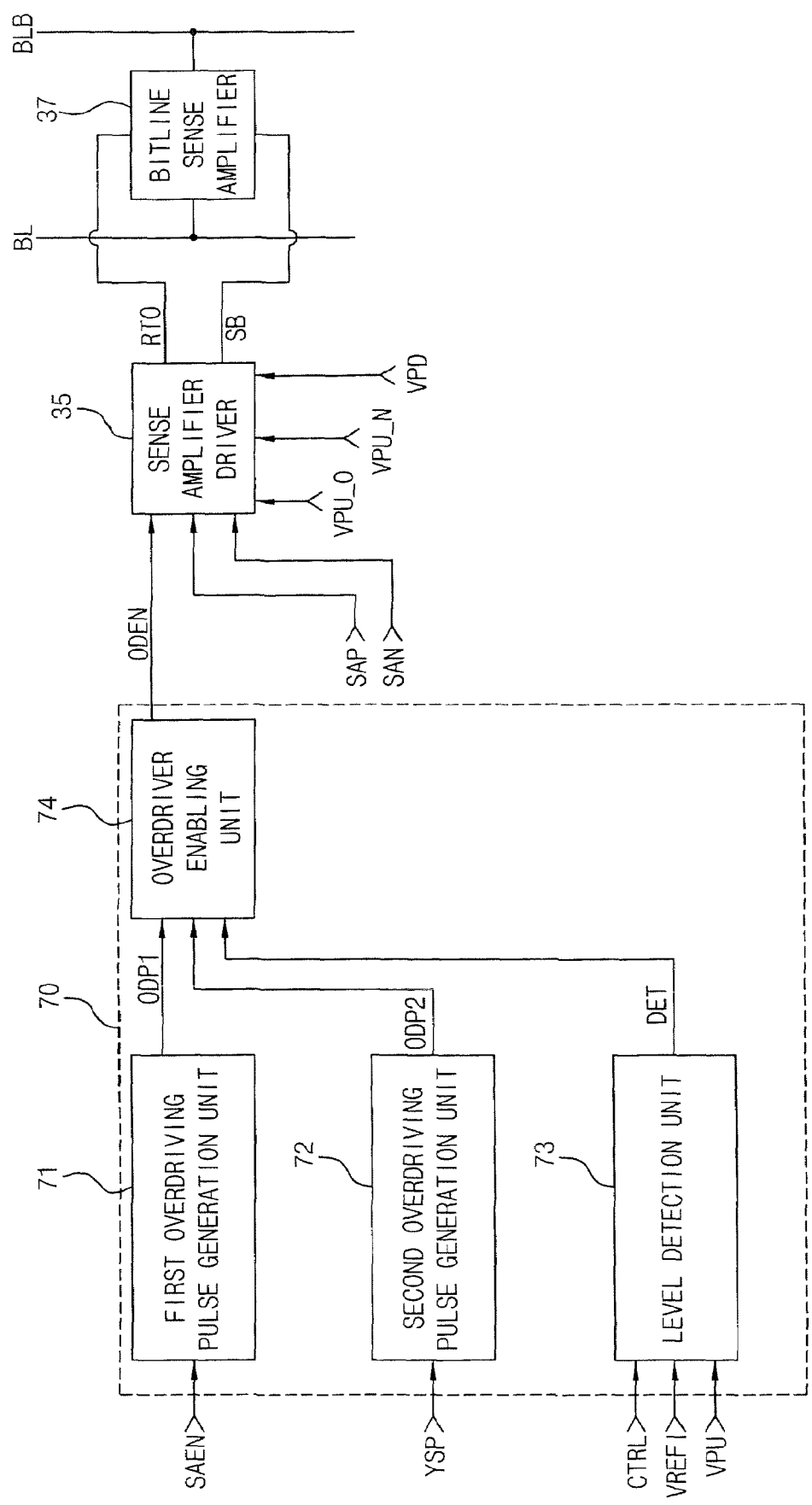
FIG. 7 is a block diagram showing a semiconductor memory device according to another embodiment of the present invention.

A semiconductor memory device according to another embodiment of the present invention is shown in FIG. 7.

Referring to FIG. 7, the semiconductor memory device according to an embodiment of the present invention includes an overdriving control unit 70, a sense amplifier driver 35, and a bitline sense amplifier 37. When compared to the previous embodiment, the overdriving control unit 70 includes an additional function in which the enabling period of the overdriver enabling signal ODEN is controlled.

Specifically, the overdriving control unit 70 includes a first overdriving pulse generation unit 71, a second overdriving pulse generation unit 72, a level detection unit 73, and an overdriver enabling unit 74.

The first and second overdriving pulse generation units 71 and 72 have the same respective configurations as the first and second overdriving pulse generation units 31 and 32 of the previously described embodiment of the present invention and thus will not be described.

The level detection unit 73 is turned on under the control of the control signal CTRL and compares the level of the pull-up voltage VPU with the level of a reference voltage VREFI to output a detection signal DET.

Herein, the control signal CTRL may be enabled when the sense amplifier is enabled, when the column is selected, or when active operation is carried out. The sense amplifier enabling signal SAEN, the column pulse YSP, the column selection signal YI, the overdriving pulses ODP1 and ODP2, the read strobe signal, the write strobe signal, or a combination of the said signals may be inputted as the control signal CTRL.

Further, the pull-up voltage VPU is a voltage supplied for the pull-up operation of the bitline sense amplifier 37. Particularly, the pull-up voltage VPU may correspond to the potential of the pull-up node RTO of the bitline sense amplifier 37, the pull-up drive node PUDN in FIG. 5, or the like.

Further, the reference voltage VREFI may be a voltage which becomes a reference voltage for overdriving when the sense amplifier is enabled and/or a voltage which becomes a reference voltage for overdriving when selecting the column.

The overdriver enabling unit 74 logically combines the overdriving pulses ODP1 and ODP2 and the detection signal DET and outputs the overdriver enabling signal ODEN.

In one circumstance, the overdriving control unit 70 (having the aforementioned configuration) detects the level of the pull-up voltage VPU to control the enabling period of the overdriver enabling signal ODEN when the overdriver enabling signal ODEN is enabled for a predetermined time in response to the sense amplifier enabling signal SAEN.

In another circumstance, the overdriving control unit 70 (having the aforementioned configuration) detects the level of the pull-up voltage VPU to control the enabling period of the overdriver enabling signal ODEN when the overdriver enabling signal ODEN is enabled for a predetermined time in response to the column pulse YSP.

In another circumstance, the overdriving control unit 70 having this configuration detects the level of the pull-up voltage VPU to control the enabling period of the overdriver enabling signal ODEN when the overdriver enabling signal ODEN is enabled for a predetermined time by the sense amplifier enabling signal SAEN and the column pulse YSP respectively.

One configuration of the overdriving control unit 70, which controls the enablement of the overdriver enabling signal ODEN when the overdriver enabling signal ODEN is enabled for a predetermined time by the column pulse YSP, will be described with reference to FIG. 8.

Figure 8:
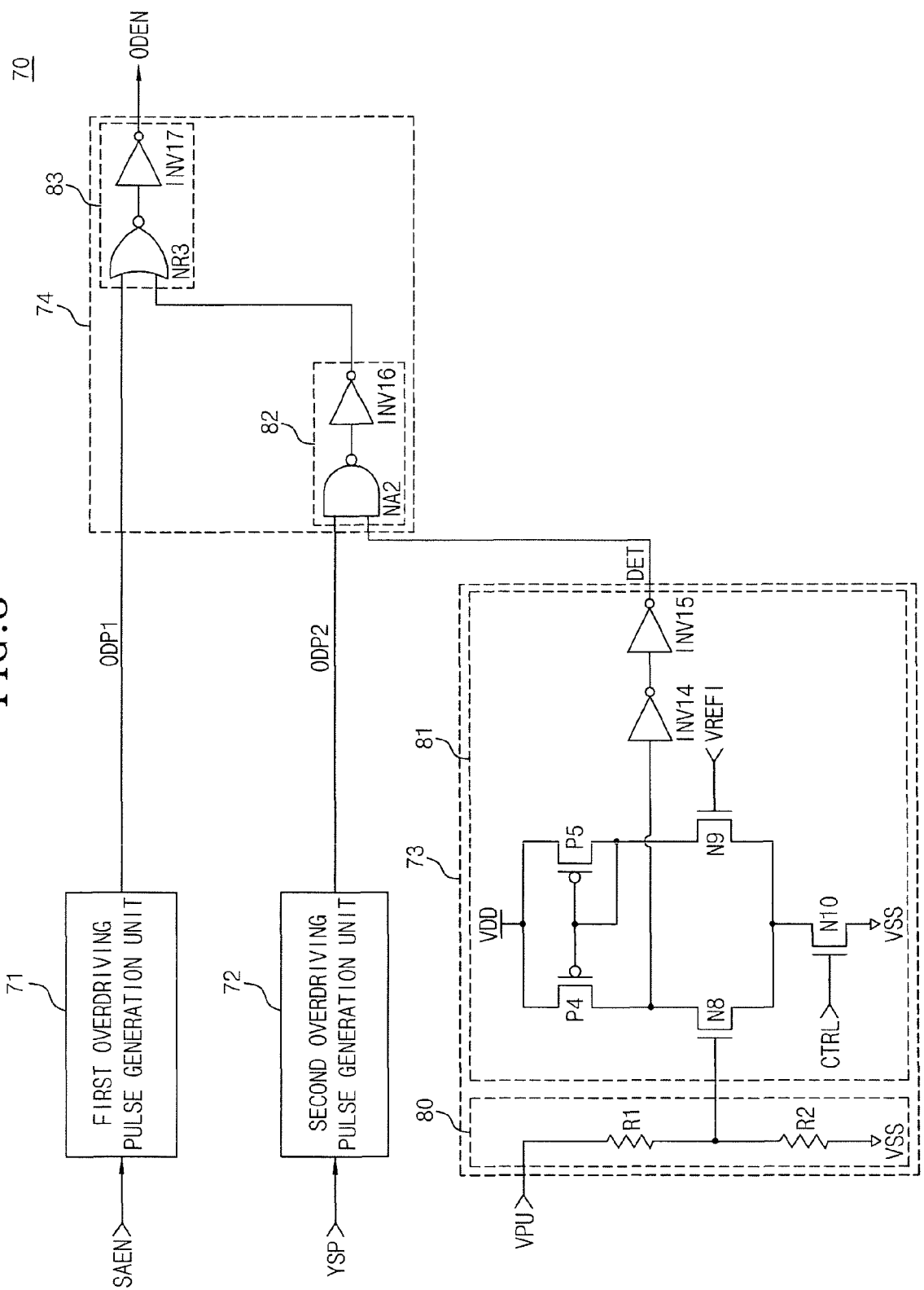
FIG. 8 is a circuit diagram showing an example of a detailed configuration of the overdriving control unit of FIG. 7.

Referring to FIG. 8, the level detection unit 73 compares the level of the pull-up voltage VPU to the level of the reference voltage VREFI to output the detection signal DET. The detection signal DET is enabled when the pull-up voltage VPU is lower than the reference voltage VREFI. At this time, it is preferable that the reference voltage VREFI correspond to the level of the normal pull-up drive voltage VPU_N.

The level detection unit 73 may include a dividing unit 80, which divides the level of the pull-up voltage VPU; and a comparing unit 81, which compares the level of the voltage divided by the dividing unit 80 to the level of the reference voltage VREFI. In this case, it is preferable that the level of the reference voltage VREFI is lower than the level of the normal pull-up drive voltage VPU_N.

The dividing unit 80 may include resistors R1 and R2 connected in series between the terminal into which the pull-up voltage VPU is inputted and a ground voltage VSS terminal.

The comparing unit 81 includes: two PMOS transistors P4 and P5 configured in a current mirror structure and receiving the power voltage VDD; two NMOS transistors N8 and N9 connected between respective PMOS transistors P4 and P5 and an NMOS transistor N10; the NMOS transistor N10, which receives the control signal CTRL via its gate and which connects a common source of the two NMOS transistors N8 and N9 to the ground voltage VSS terminal; an inverter INV14, which inverts the signal generated between the PMOS transistor P4 and the NMOS transistor N8; and an inverter INV15, which inverts the output of the inverter INV14 to output the detection signal DET. Herein, the two NMOS transistors N8 and N9 receive the voltage divided by the dividing unit 80 and the reference voltage VREFI via their respective gates.

The overdriver enabling unit 74 combines the overdriving pulses ODP1 and ODP2 and the detection signal DET to output the overdriver enabling signal ODEN. Enabling of the outputted overdriver enabling signal ODEN by the overdriving pulse ODP2 is controlled by the detection signal DET.

The overdriver enabling unit 74 may include a combining unit 82, which logically combines the overdriving pulse ODP2 and the detection signal DET; and a combining unit 83, which logically combines the overdriving pulse ODP1 and the output of the combining unit 82 to output the overdriver enabling signal ODEN.

Herein, the combining unit 82 may be configured so as to output the overdriving pulse ODP2 when the detection signal DET is in an enabled state and to disable the overdriving pulse ODP2 when the detection signal DET is in a disabled state.

For example, the combining unit 82 may include a NAND gate NA2, which performs a NAND logical operation on the overdriving pulse ODP2 and the detection signal DET; and an inverter INV16, which inverts the output of the NAND gate NA2.

The combining unit 83 may be configured so as to enable and output the overdriver enabling signal ODEN when at least one of the overdriving pulse ODP1 and the output of the combining unit 82 is in an enabled state.

For example, the combining unit 83 may include a NOR gate NR3, which performs a NOR logical operation on the overdriving pulse ODP1 and output of the combining unit 82; and an inverter INV17, which inverts the output of the NOR gate NR3.

In the semiconductor memory device according to an embodiment of the present invention that includes the overdriving control unit 70 of FIG. 8, the level of the pull-up voltage VPU is compared to the level of the reference voltage REFI, and the overdriver enabling signal ODEN is enabled only when the pull-up voltage VPU drops below the reference voltage REFI after the column pulse YSP is generated.

In other words, the semiconductor memory device according to an embodiment of the present invention detects the level of the pull-up voltage VPU (which determines the potential of the bitline BL) and enables the overdriver enabling signal ODEN when the pull-up voltage VPU drops more than a predetermined level, thereby controlling the overdriving of the bitline sense amplifier 37.

Accordingly, the overdriver enabling signal ODEN is enabled and an overdrive voltage VPU_O having a higher level than that of the normal pull-up drive voltage VPU_N is supplied to the pull-up node RTO when the column selection signal YI is enabled; and thus when the potential of the bitline BL drops, the potential of the bitline BL does not drop more than a predetermined level.

As such, the semiconductor memory device according to an embodiment of the present invention including the overdriving control unit of FIG. 8 controls the bitline sense amplifier 37 such that overdriving occurs only when the pull-up voltage VPU (which corresponds to the potential of the pull-up drive node PUDN of the sense amplifier driver 35 or the pull-up node RTO of the bitline sense amplifier 37) drops more than a predetermined level at the time of column selection.

Therefore, the enabled/disabled state of the overdriver enabling signal ODEN is controlled so that unnecessary overdriving does not occur during the prevention of a large drop in the potential of the bitline (as described above, the large drop occurs when the column selection signal YI is enabled and the bitline pair and the local data line pair are connected); and therefore, this embodiment provides an advantage in that unnecessary current consumption is reduced.

Additionally, since the level detection unit 73, which detects the level of the pull-up voltage VPU, operates under the control of the control signal CTRL, it is possible to minimize current consumption using the level detection unit 73 by using a predetermined signal that includes the enabling period of the column selection signal YI as the control signal CTRL.

Meanwhile, though not shown, in another example, the overdriving control unit 70 may be configured so as to detect the level of the pull-up voltage VPU and control the enabling period of the overdriver enabling signal ODEN when the overdriver enabling signal ODEN is enabled for a predetermined time by the sense amplifier enabling signal SAEN.

Specifically, the level detection unit 73 compares the level of the pull-up voltage VPU to the reference voltage VREFI and outputs an enabled detection signal DET when the pull-up voltage VPU is higher than the reference voltage VREFI. At this time, it is preferable that the reference voltage VREFI have a level between the normal pull-up drive voltage VPU_N and the overdrive voltage VPU_O.

Further, enabling of the overdriver enabling signal ODEN, which is output from the overdriver enabling unit 74, is controlled using the detection signal DET, so that the pull-up voltage VPU does not exceed the level of the reference voltage VREFI for a predetermined time from the point that the sense amplifier enabling signal SAEN is enabled.

In this case, the overdriver enabling unit 74 may include: a first combining unit, which logically combines the overdriving pulse ODP1 and the detection signal DET to output a combined signal which is disabled when the detection signal DET is in an enabled state and which corresponds to the overdriving pulse ODP1 when the detection signal DET is in a disabled state; and a second combining unit, which logically combines the combined signal and the overdriving pulse ODP2 to output an overdriving enabling signal ODEN that is enabled when at least one of the combined signal and the overdriving pulse ODP2 is enabled.

The overdriving control unit 70 having the aforementioned configuration detects the level of the pull-up voltage VPU and controls the enablement of the overdriver enabling signal ODEN when the sense amplifier initially overdrives, i.e. the overdriving period from the point when the sense amplifier enabling signal SAEN is enabled.

At this time, the overdriving control unit 70 disables the overdriver enabling signal ODEN when the pull-up voltage VPU is above a predetermined level (the level of the reference voltage VREFI).

In other words, when the pull-up voltage VPU rapidly increases due to excessive overdriving, the overdriver enabling signal ODEN is disabled to stop overdriving when the pull-up voltage VPU exceeds a predetermined level.

Therefore, the pull-up voltage VPU can be maintained at a normal level during normal drive operation of the bitline sense amplifier, and accordingly there is an advantage in that defects in the subsequent precharge operation are not generated.

Additionally, when overdriving is insufficient (and thus the pull-up voltage VPU is raised slowly) the overdriver enabling signal ODEN maintains an enabled state until the pull-up voltage VPU reaches a predetermined level.

Therefore, there is an advantage in that tRCD properties are improved since overdriving of the bitline sense amplifier is carried out sufficiently.

Meanwhile, though not shown, in another example, the overdriving control unit 70 may be configured so as to detect the level of the pull-up voltage VPU and control the enabling period of the overdriver enabling signal ODEN such that the overdriver enabling signal ODEN is enabled for a predetermined time according to the sense amplifier enabling signal SAEN and the column pulse YSP.

Specifically, the level detection unit 73 includes a first detection unit, which compares the levels of the pull-up voltage VPU and the reference voltage VREFI1 to output a detection signal DET1 which is enabled when the pull-up voltage VPU is higher than the reference voltage VREFI1; and a second detection unit, which compares the levels of the pull-up voltage VPU and the reference voltage VREFI2 to output a detection signal DET2 which is enabled when the pull-up voltage VPU is higher than the reference voltage VREFI2. At this time, it is preferable that the reference voltage VREFI1 has a level between the normal pull-up drive voltage VPU_N and the overdrive voltage VPU_O and the reference voltage VREFI2 has the level lower than the normal pull-up drive voltage VPU_N.

Further, enabling of the overdriver enabling signal ODEN, which is output via the overdriver enabling unit 74, is controlled using the detection signal DET1 so that the pull-up voltage VPU does not exceed the level of the reference voltage VREFI1 for a predetermined time from the point when the sense amplifier enabling signal SAEN is enabled. Enabling of the overdriver enabling signal ODEN is also controlled using the detection signal DET2, so that the pull-up voltage VPU does not drop below the level of the reference voltage VREFI2 for a predetermined time from the point when the column pulse YSP is enabled.

This overdriver enabling unit 74 may include: a first combining unit, which logically combines the overdriving pulse ODP1 and the detection signal DET1 to output a first combined signal corresponding to the overdriving pulse ODP1 when the detection signal DET1 is in a disabled state and which is disabled when the detection signal DET1 is in an enabled state; a second combining unit, which logically combines the overdriving pulse ODP2 and the detection signal DET2 to output a second combined signal corresponding to the overdriving pulse ODP2 when the detection signal DET2 is in an enabled state and which is disabled when the detection signal DET2 is in a disabled state; and a third combining unit, which logically combines the first combined signal and the second combined signal to output an enabled overdriving enabling signal ODEN when at least one of the first and second combined signals is enabled.

This configuration of the overdriving control unit 70 includes each previously described example of the overdriving control unit 70.

As is apparent from the above description, in the present invention, the data line pair can have sufficient potential difference even within a tRCD_min condition by preventing a drop in the potential of the bitline by enabling an overdrive operation at a time of column selection, and thereby the present invention prevents defects in the data sense amplifier and in subsequent operation.

Additionally, in the present invention it is possible to prevent defects caused by a lack of or excess overdriving by detecting the potential of the bitline and properly controlling the overdriving period during initial overdriving by the bitline sense amplifier occurring after the bitline sense amplifier is enabled.

Additionally, in the present invention, it is possible to reduce current consumption due to unnecessary overdriving by detecting the potential of the bitline at the time of a column operation and controlling whether overdriving is carried out.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device, comprising:
an overdriving control unit generating an overdriver enabling signal having an enabling period including a point to enable a bitline sense amplifier and a point to select a column; and
an overdriver providing an overdrive voltage having a higher level than a level of a normal pull-up drive voltage to a pull-up node of the bitline sense amplifier in response to the overdriver enabling signal,
wherein the overdriving control unit generates the overdriver enabling signal in response to a sense amplifier enabling signal and a column pulse, wherein the sense amplifier enabling signal is enabled by an active command and disabled by a precharge command and the column pulse is a source of a column selection signal for connecting a bitline to a data line.

2. The semiconductor memory device as set forth in claim 1, wherein the overdriver enabling signal generated by the overdriving control unit comprises a first enabling period including the point to enable a bitline sense amplifier and a second enabling period including the point to select a column, and the first enabling period is enabled in response to the sense amplifier enabling signal and the second enabling period is enabled in response to the column pulse, wherein the first and the second enabling periods are mutually separated.

3. The semiconductor memory device as set forth in claim 2, wherein the overdriving control unit comprises:
a first overdriving pulse generation unit generating a first overdriving pulse having the first enabling period in response to the sense amplifier enabling signal;
a second overdriving pulse generation unit generating a second overdriving pulse having the second enabling period in response to the column pulse; and
an overdriver enabling unit generating the overdriver enabling signal by combining logically the first overdriving pulse with the second overdriving pulse.

4. The semiconductor memory device as set forth in claim 3, wherein the second overdriving pulse generation unit generates the second overdriving pulse having the second enabling period such that the second enabling period begins prior to an enabling period of the column selection signal generated by the column pulse and such that the second enabling period ends after the enabling period of the column selection signal.

5. The semiconductor memory device as set forth in claim 3, wherein the overdriver enabling signal generated by the overdriver enabling unit is enabled when at least one of the first overdriving pulse and the second overdriving pulse is in an enabled state.

6. The semiconductor memory device as set forth in claim 3, wherein the overdriving control unit further comprises:
a level detection unit outputting a detection signal by comparing the overdrive voltage with a reference voltage; and
a combining unit logically combining the detection signal and the second overdriving pulse and providing the combined signal to the overdriver enabling unit.

7. The semiconductor memory device as set forth in claim 6, wherein the level detection unit enables and outputs the detection signal when the overdrive voltage is lower than a level of the reference voltage.

8. The semiconductor memory device as set forth in claim 7, wherein the combining unit disables the second overdriving pulse when the detection signal is in a disabled state and enables the second overdriving pulse when the detection signal is in an enabled state, and provides the enabled or disabled second overdriving pulse to the overdriver enabling unit.

9. A semiconductor memory device, comprising:
a sense amplifier driver providing a normal pull-up drive voltage to a pull-up node, providing a normal pull-down drive voltage to a pull-down node, and selectively providing an overdrive voltage having a level higher than a level of the normal pull-up drive voltage to the pull-up node according to an enablement state of an overdriver enabling signal;
a bitline sense amplifier sense amplifying a difference in potential between bitlines of a bitline pair with the voltages supplied to the pull-up node and the pull-down node; and
an overdriving control unit generating the overdriver enabling signal having an enabling period including a point to select a column and detecting a potential of the pull-up node to control the enablement state of the overdriver enabling signal.

10. The semiconductor memory device as set forth in claim 9, wherein the overdriving control unit comprises:
an overdriving pulse generation unit generating an overdriving pulse in response to a column pulse generated by a column command;
a level detection unit outputting a detection signal by comparing the level of the potential of the pull-up node to the level of the reference voltage; and
an overdriver enabling unit generating the overdrive enabling signal by combining logically the overdriving pulse with the detection signal.

11. The semiconductor memory device as set forth in claim 10, wherein the overdriving pulse generation unit generates the overdriving pulse such that the overdriving pulse is enabled prior to an enabling period of a column selection signal generated by the column pulse and such that the overdriving pulse is disabled after the enabling period of the column selection signal.

12. The semiconductor memory device as set forth in claim 10, wherein the level detection unit compares the potential of the pull-up node to the level of the reference voltage in response to a strobe signal generated during a read or write operation.

13. The semiconductor memory device as set forth in claim 10, wherein the level detection unit enables and outputs the detection signal when the potential of the pull-up node is lower than the level of the reference voltage.

14. The semiconductor memory device as set forth in claim 13, wherein the overdriver enabling unit disables and outputs the overdriver enabling signal when the detection signal is in a disabled state and enables and outputs the overdriver enabling signal when the detection signal is in an enabled state.

15. A semiconductor memory device, comprising:
a first overdriving pulse generation unit generating a first overdriving pulse In response to a sense amplifier enabling signal, the first overdriving pulse having a first enabling period including a point to enable a bitline sense amplifier;
a second overdriving pulse generation unit generating a second overdriving pulse in response to a column pulse generated by a column command, the second overdriving pulse having a second enabling period including a point to select a column;
a level detection unit outputting a detection signal by comparing a potential of a pull-up node of a bitline sense amplifier to a level of a reference voltage;
an overdriver enabling unit generating an overdriver enabling signal by logically combining the first and second overdriving pulses with the detection signal; and
an overdriver providing an overdrive voltage of a level higher than the level of the normal pull-up drive voltage to the pull-up node of the bitline sense amplifier in response to the overdriver enabling signal.

16. The semiconductor memory device as set forth in claim 15, wherein the sense amplifier enabling signal is a signal enabled by an active command and disabled by a precharge command, and the column pulse is a source of a column selection signal for connecting the bitline and the data line.

17. The semiconductor memory device as set forth in claim 16, wherein the second overdriving pulse generation unit generates the second overdriving pulse having the second enabling period such that the second enabling period begins prior to an enabling period of the column selection signal and the second enabling period ends after the enabling period of the column selection signal.

18. The semiconductor memory device as set forth in claim 15, wherein the level detection unit enables and outputs the detection signal when the level of. the overdrive voltage is higher than the level of the reference voltage.

19. The semiconductor memory device as set forth in claim 18, wherein the overdriver enabling unit comprises:
  a first combining unit logically combining the first overdriving pulse and the detection signal and outputting a combined signal which corresponds to the first overdriving pulse when the detection signal is in a disabled state and which is disabled when the detection signal is in an enabled state; and
  a second combining unit logically combining the combined signal and the second overdriving pulse and outputting the overdriver enabling signal, wherein the overdriver enabling signal is enabled when at least one of the combined signal and the second overdriving pulse is enabled.

20. The semiconductor memory device as set forth in claim 15, wherein the level detection unit enables and outputs the detection signal when the level of the overdrive voltage is lower than the level of the reference voltage.

21. The semiconductor memory device as set forth in claim 20, wherein the overdriver enabling unit comprises:
  a first combining unit logically combining the second overdriving pulse and the detection signal and outputting a combined signal which corresponds to the second overdriving pulse when the detection signal is in an enabled state and which is disabled when the detection signal is in a disabled state; and
  a second combining unit logically combining the combined signal and the first overdriving pulse and outputting the overdriver enabling signal, wherein the overdriver enabling signal is enabled when at least one of the combined signal and the first overdriving pulse is enabled.

22. The semiconductor memory device as set forth in claim 15, wherein the level detection unit comprises:
  a first detection unit comparing the levels of the overdrive voltage and the first reference voltage, and enabling and outputting the first detection signal when the level of the overdrive voltage is higher than the level of the first reference voltage; and
  a second detection unit comparing the levels of the overdrive voltage and the second reference voltage, and enabling and outputting the second detection signal when the level of the overdrive voltage is lower than the level of the second reference voltage.

23. The semiconductor memory device as set forth in claim 22, wherein the overdriver enabling unit comprises:
  a first combining unit logically combining the first overdriving pulse and the first detection signal and outputting a first combined signal which corresponds to the first overdriving pulse when the first detection signal is in a disabled state and which is disabled when the first detection signal is in an enabled state;
  a second combining unit logically combining the second overdriving pulse and the second detection signal and outputting a second combined signal which corresponds to the second overdriving pulse when the second detection signal is in an enabled state and which is disabled when the second detection signal is in a disabled state; and
  a third combining unit logically combining the first combined signal with the second combined signal and outputting the overdriver enabling signal, wherein the overdriver enabling signal is enabled when at least one of the first and second combined signals is enabled.

24. A bitline sense amplifying method, comprising:
  a first overdriving step comprising differential amplifying a bitline pair with an overdrive voltage and a normal pull-down drive voltage for a period from an enabling point of a sense amplifier enabling signal to a first point;
  a first normal driving step comprising differential amplifying the bitline pair with a normal pull-up drive voltage and the normal pull-down drive voltage for a period from the first point to an enabling point of a column pulse;
  a second overdriving step comprising differential amplifying the bitline pair with the overdrive voltage and the normal pull-down drive voltage for a period from the enabling point of a column pulse to a second point; and
  a second normal driving step comprising differential amplifying the bitline pair with the normal pull-up drive voltage and the normal pull-down drive voltage for a period from the second point to a precharge point.

25. The bitline sense amplifying method as set forth in claim 24, wherein the overdrive voltage is a voltage having a higher level than a level of the normal pull-up drive voltage, and the normal pull-up drive voltage is a voltage having a higher level than a level the normal pull-down drive voltage.

26. The bitline sense amplifying method as set forth in claim 25, wherein the overdrive voltage is a power voltage or a boosting voltage, the normal pull-up drive voltage is a core voltage, and the normal pull-down drive voltage is a ground voltage.

27. The bitline sense amplifying method as set forth in claim 24, wherein the sense amplifier enabling signal is a signal enabled by an active command and disabled by a precharge command, and the column pulse is a source of a column selection signal for connecting the bitline pair to a data line pair.

28. The bitline sense amplifying method as set forth in claim 24, wherein the bitline pair and a data line pair are connected for a period within the period from the enabling point of the column pulse to the second point.

29. The bitline sense amplifying method as set forth in claim 24, wherein the first overdriving step further comprises detecting a potential of a first bitline amplified with the overdrive voltage and adjusting the first point according to the detected potential.

30. The bitline sense amplifying method as set forth in claim 29, wherein the first point is adjusted such that the first point is set when the potential of the first bitline exceeds the level of a reference voltage.

31. The bitline sense amplifying method as set forth in claim 24, wherein the second overdriving step further comprises detecting a potential of a first bitline and adjusting a point at which the first bitline is amplified with the overdriving voltage.

32. The bitline sense amplifying method as set forth in claim 31, wherein when detecting the potential of the first bit line, the first bitline is amplified with the first overdrive voltage when the potential of the first bitline is lower than the level of the reference voltage.

* * * * *